(12) United States Patent
Hirose et al.

(10) Patent No.: US 10,559,462 B2
(45) Date of Patent: Feb. 11, 2020

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Yoshiro Hirose, Toyama (JP); Yoshitomo Hashimoto, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 26 days.

(21) Appl. No.: 15/883,962

(22) Filed: Jan. 30, 2018

(65) Prior Publication Data

US 2018/0218898 A1 Aug. 2, 2018

(30) Foreign Application Priority Data

Feb. 1, 2017 (JP) .................. 2017-016508

(51) Int. Cl.
*H01L 21/02* (2006.01)
*C23C 16/52* (2006.01)
(Continued)

(52) U.S. Cl.
CPC ...... *H01L 21/0228* (2013.01); *C23C 16/4412* (2013.01); *C23C 16/45527* (2013.01);
(Continued)

(58) Field of Classification Search
CPC ......... H01L 21/02115; H01L 21/02252; H01L 21/02263; H01L 21/02271;
(Continued)

(56) References Cited

U.S. PATENT DOCUMENTS 8,809,204 B2 * 8/2014 Akae ................. C23C 16/45525
257/E21.283
9,425,075 B2 * 8/2016 Sano ................. H01L 21/67109
(Continued)

FOREIGN PATENT DOCUMENTS

JP 2014-183218 A 9/2014
JP 2014-183219 A 9/2014
(Continued)

OTHER PUBLICATIONS

Korean Office Action dated Feb. 4, 2019 for the Korean Patent Application No. 10-2018-0009888.

*Primary Examiner* — Maliheh Malek
(74) *Attorney, Agent, or Firm* — Volpe and Koening, P.C.

(57) ABSTRACT

There is provided a technique which includes: forming a film containing at least Si, O and N on a substrate in a process chamber by performing a cycle a predetermined number of times, the cycle including non-simultaneously performing: forming a first layer by supplying a precursor gas containing at least a Si—N bond and a Si—Cl bond and a first catalyst gas to the substrate; exhausting the precursor gas and the first catalyst gas in the process chamber through an exhaust system; forming a second layer by supplying an oxidizing gas and a second catalyst gas to the substrate to modify the first layer; and exhausting the oxidizing gas and the second catalyst gas in the process chamber through the exhaust system.

19 Claims, 7 Drawing Sheets

(51) Int. Cl.
*C23C 16/455* (2006.01)
*C23C 16/44* (2006.01)
*C23C 16/54* (2006.01)

(52) U.S. Cl.
CPC .. *C23C 16/45544* (2013.01); *C23C 16/45553* (2013.01); *C23C 16/52* (2013.01); *H01L 21/0214* (2013.01); *H01L 21/02219* (2013.01); *H01L 21/02222* (2013.01); *H01L 21/0217* (2013.01); *H01L 21/02126* (2013.01)

(58) Field of Classification Search
CPC ......... H01L 21/02274; H01L 21/67005; H01L 21/67011; H01L 21/02219; H01L 21/02222; H01L 21/02205; H01L 21/02208; H01L 21/02211; H01L 21/02214; H01L 21/02216; H01L 21/02112; H01L 21/02123; H01L 21/02126; H01L 21/021137; H01L 21/0214; H01L 21/02164; H01L 21/0217; H01L 21/285; H01L 21/0251; H01L 21/02334; H01L 21/0226; C23C 16/308; C23C 16/4412; C23C 16/45527; C23C 16/45553; C23C 16/52; C23C 16/54
See application file for complete search history.

(56) References Cited

U.S. PATENT DOCUMENTS

| | | | | |
|---|---|---|---|---|
| 10,128,104 B2* | 11/2018 | Sano | ........................ | C23C 16/36 |
| 10,269,560 B2* | 4/2019 | Chiu | .................. | H01L 21/0228 |
| 2006/0205231 A1* | 9/2006 | Chou | ........................ | C23C 16/36 |
| | | | | 438/770 |
| 2008/0063791 A1* | 3/2008 | Hasebe | ................. | C03C 17/225 |
| | | | | 427/96.8 |
| 2009/0011607 A1* | 1/2009 | Smythe | ............. | H01L 21/02164 |
| | | | | 438/761 |
| 2010/0221925 A1* | 9/2010 | Lee | ....................... | C23C 16/045 |
| | | | | 438/792 |
| 2011/0076789 A1* | 3/2011 | Kuroda | ................. | H01L 21/266 |
| | | | | 438/14 |
| 2012/0213940 A1* | 8/2012 | Mallick | ................. | C23C 16/345 |
| | | | | 427/535 |
| 2013/0252435 A1* | 9/2013 | Shimamoto | ....... | H01L 21/02263 |
| | | | | 438/758 |
| 2013/0323435 A1* | 12/2013 | Xiao | ........................ | C09D 1/00 |
| | | | | 427/579 |
| 2014/0158580 A1* | 6/2014 | Xiao | ........................ | C07F 7/10 |
| | | | | 206/524.3 |
| 2014/0220788 A1* | 8/2014 | Sano | ................. | H01L 21/67109 |
| | | | | 438/775 |
| 2014/0287596 A1* | 9/2014 | Hirose | .................. | H01L 21/022 |
| | | | | 438/786 |
| 2014/0287598 A1* | 9/2014 | Hirose | ............. | H01L 21/02164 |
| | | | | 438/787 |
| 2014/0342573 A1* | 11/2014 | Hirose | .................... | C23C 16/36 |
| | | | | 438/761 |
| 2015/0072537 A1* | 3/2015 | Noda | ................. | H01L 21/02126 |
| | | | | 438/786 |
| 2015/0243499 A1* | 8/2015 | Yamamoto | .............. | C23C 16/52 |
| | | | | 438/763 |
| 2015/0267296 A1* | 9/2015 | Nishida | ............... | H01L 21/0214 |
| | | | | 438/787 |
| 2016/0086791 A1* | 3/2016 | Sano | ...................... | H01L 21/022 |
| 2016/0225607 A1* | 8/2016 | Yamamoto | .......... | H01L 21/0228 |
| 2016/0284542 A1* | 9/2016 | Noda | ............... | H01L 21/02274 |
| 2016/0322212 A1* | 11/2016 | Kamakura | .......... | H01L 21/0228 |
| 2016/0376699 A1* | 12/2016 | Sasaki | ............... | H01J 37/32449 |
| | | | | 118/697 |
| 2017/0011908 A1* | 1/2017 | Matsuoka | ......... | C23C 16/45531 |
| 2017/0025271 A1* | 1/2017 | Hashimoto | ............. | C23C 16/52 |
| 2017/0040157 A1* | 2/2017 | Hashimoto | ......... | H01L 21/0228 |
| 2017/0051405 A1* | 2/2017 | Fukazawa | ......... | C23C 16/45536 |
| 2017/0051408 A1* | 2/2017 | Takagi | ............. | C23C 16/45563 |
| 2017/0092503 A1* | 3/2017 | Degai | ............... | H01L 21/32051 |
| 2017/0103885 A1* | 4/2017 | Nakamura | ............ | C23C 16/02 |
| 2017/0162386 A1* | 6/2017 | Hashimoto | ........... | C23C 16/325 |
| 2017/0170004 A1* | 6/2017 | Harada | ............ | C23C 16/45527 |
| 2017/0263439 A1* | 9/2017 | Hashimoto | ....... | C23C 16/45527 |
| 2017/0287696 A1* | 10/2017 | Noda | ................... | C23C 16/455 |
| 2017/0301539 A1* | 10/2017 | Sano | ....................... | C23C 16/36 |
| 2017/0342559 A1* | 11/2017 | Fukazawa | ......... | C23C 16/45527 |
| 2018/0076017 A1* | 3/2018 | Hashimoto | ......... | C23C 16/4412 |
| 2018/0090313 A1* | 3/2018 | Chung | .................. | C23C 16/045 |
| 2018/0230591 A1* | 8/2018 | Jang | ........................ | C23C 16/513 |
| 2019/0003047 A1* | 1/2019 | Tateno | ................. | C23C 16/4485 |
| 2019/0085459 A1* | 3/2019 | Sone | ........................ | C23C 16/56 |
| 2019/0148151 A1* | 5/2019 | Okuno | ............. | H01L 21/28141 |
| | | | | 257/401 |
| 2019/0189432 A1* | 6/2019 | Nakatani | ................. | C23C 16/36 |
| 2019/0218666 A1* | 7/2019 | Harada | ................. | C23C 16/455 |
| 2019/0267230 A1* | 8/2019 | Harada | ............... | H01L 21/0228 |

FOREIGN PATENT DOCUMENTS

| | | |
|---|---|---|
| KR | 20140114761 A | 9/2014 |
| KR | 20160093570 A | 8/2016 |

\* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2017-016508, filed on Feb. 1, 2017, the entire contents of which are incorporated herein by reference.

TECHNICAL FIELD

The present disclosure relates to a method of manufacturing a semiconductor device, a substrate processing apparatus, and a recording medium.

BACKGROUND

As an example of processes of manufacturing a semiconductor device, a process of forming a silicon (Si)-based insulating film on a substrate is often carried out in the related art.

SUMMARY

Some embodiments of the present disclosure provide a technique capable of increasing the productivity of a film forming process and improving the controllability of the composition ratio of a film when forming a Si-based insulating film on a substrate.

According to one embodiment of the present disclosure, there is provided a technique, including: forming a film containing at least Si, O and N on a substrate in a process chamber by performing a cycle a predetermined number of times, the cycle including non-simultaneously performing: forming a first layer by supplying a precursor gas containing at least a Si—N bond and a Si—Cl bond and a first catalyst gas to the substrate; exhausting the precursor gas and the first catalyst gas in the process chamber through an exhaust system; forming a second layer by supplying an oxidizing gas and a second catalyst gas to the substrate to modify the first layer; and exhausting the oxidizing gas and the second catalyst gas in the process chamber through the exhaust system.

DETAILED DESCRIPTION

One Embodiment of the Present Disclosure

One embodiment of the present disclosure will now be described with reference to FIGS. 1 to 3.

(1) Configuration of Substrate Processing Apparatus

Figure 1:
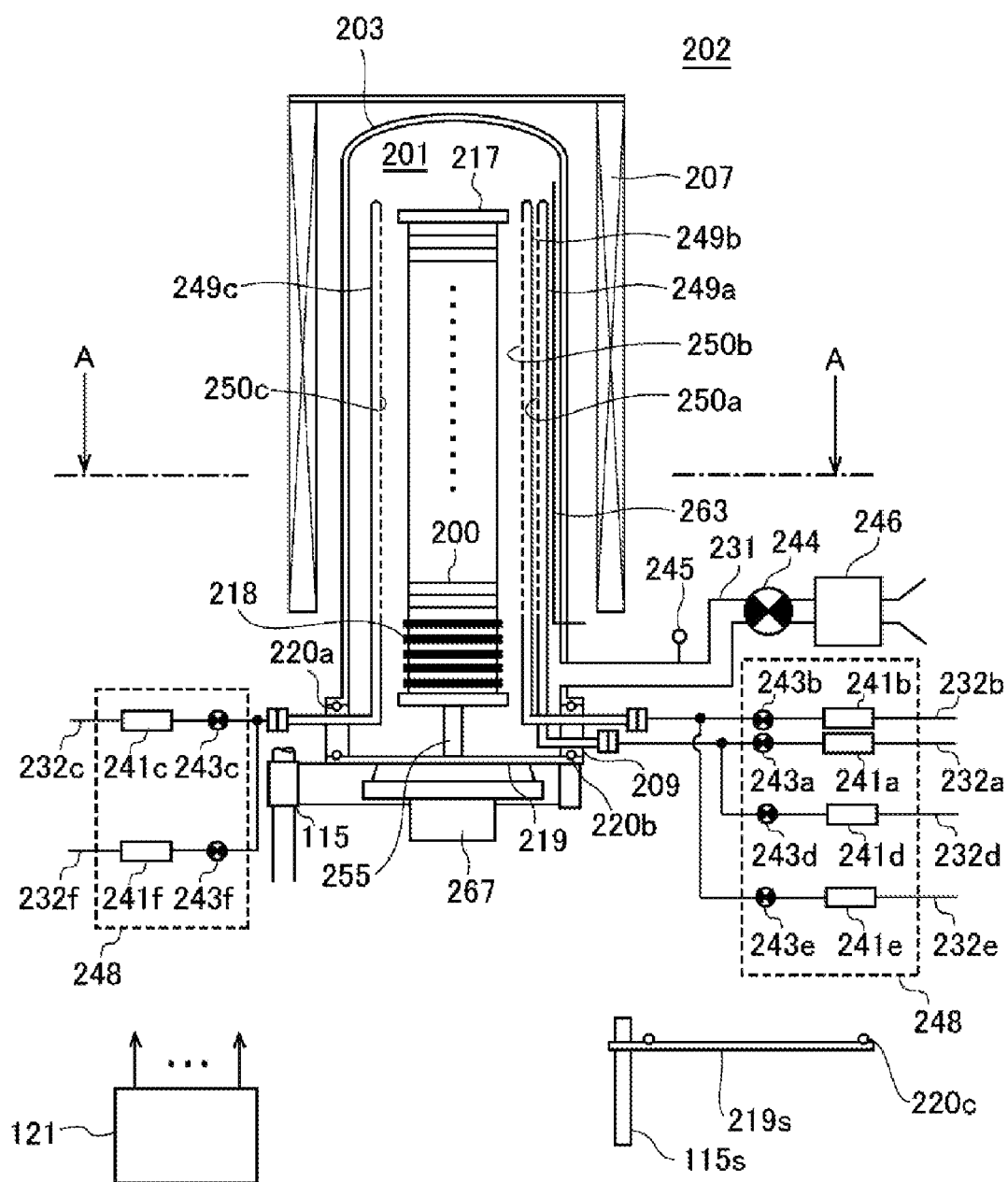
FIG. 1 is a schematic configuration view of a vertical processing furnace of a substrate processing apparatus used in an embodiment of the present disclosure, in which a portion of the processing furnace is shown in a vertical cross section.

As shown in FIG. 1, a processing furnace 202 includes a heater 207 as a heating mechanism (a temperature adjustment part). The heater 207 has a cylindrical shape and is supported by a support plate so as to be vertically installed. The heater 207 functions also as an activation mechanism (an excitation part) configured to thermally activate (excite) a gas.

A reaction tube 203 is disposed inside the heater 207 in a concentric relationship with the heater 207. The reaction tube 203 is made of, e.g., a heat resistant material such as quartz ($SiO_2$), silicon carbide (SiC) or the like and has a cylindrical shape with its upper end closed and its lower end opened. A manifold 209 is disposed in a concentric relationship with the reaction tube 203 under the reaction tube 203. The manifold 209 is made of, e.g., metal such as stainless steel (SUS) or the like and has a cylindrical shape with its upper end closed and its lower end opened. The upper end portion of the manifold 209 engages with the lower end portion of the reaction tube 203 so as to support the reaction tube 203. An O-ring 220a serving as a seal member is installed between the manifold 209 and the reaction tube 203. Like the heater 207, the reaction tube 203 is vertically installed. A process vessel (reaction vessel) is mainly constituted by the reaction tube 203 and the manifold 209. A process chamber 201 is formed in a hollow cylindrical portion of the process vessel. The process chamber 201 is configured to accommodate wafers 200 as substrates.

Nozzles 249a to 249c are installed in the process chamber 201 so as to penetrate through a sidewall of the manifold 209. Gas supply pipes 232a to 232c are respectively connected to the nozzles 249a to 249c.

Mass flow controllers (MFCs) 241a to 241c, which are flow rate controllers (flow rate control parts), and valves 243a to 243c, which are opening/closing valves, are installed in the gas supply pipes 232a to 232c in this order from the corresponding upstream sides, respectively. Gas supply pipes 232d to 232f, which supply an inert gas, are respectively connected to the gas supply pipes 232a to 232c at the downstream side of the valves 243a to 243c. MFCs 241d to 241f and valves 243d to 243f are installed in the gas supply pipes 232d to 232f in this order from the corresponding upstream sides, respectively.

Figure 2:
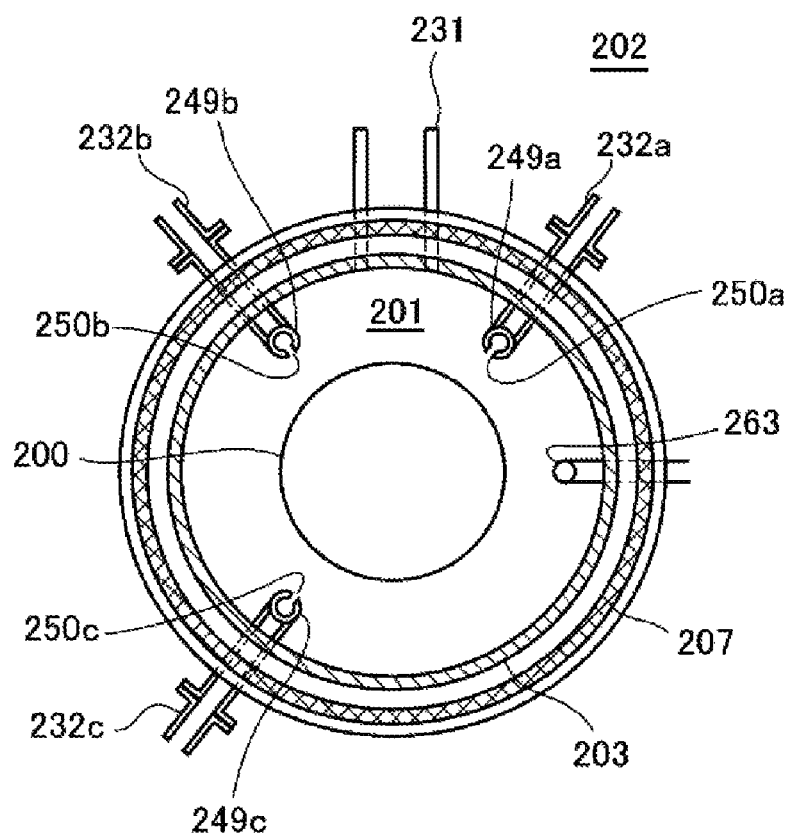
FIG. 2 is a schematic configuration view of a portion of the vertical processing furnace of the substrate processing apparatus used in an embodiment of the present disclosure, in which the portion of the processing furnace is shown in a cross section taken along line A-A in FIG. 1.

As shown in FIG. 2, each of the nozzles 249a to 249c is disposed in an annular space (when viewed from top) between the inner wall of the reaction tube 203 and the wafers 200 so as to extend upward along a stack direction of the wafers 200 from a lower portion of the inner wall of the reaction tube 203 to an upper portion thereof. Specifically, each of the nozzles 249a to 249c is installed in a region horizontally surrounding a wafer arrangement region in which the wafers 200 are arranged at a lateral side of the wafer arrangement region, along the wafer arrangement region. Gas supply holes 250a to 250c for supplying a gas are formed on the side surfaces of the nozzles 249a to 249c, respectively. Each of the gas supply holes 250a to 250c is opened toward the center of the reaction tube 203 to allow the gas to be supplied toward the wafers 200. The gas supply holes 250a to 250c may be formed between the lower portion of the reaction tube 203 and the upper portion thereof.

As a precursor (precursor gas), a halosilane precursor gas containing at least Si, nitrogen (N) and chlorine (Cl) and having silazane bonds, such as Si—N—Si bonds and Si—N bonds, and Si—Cl bonds is supplied from the gas supply pipe 232a into the process chamber 201 via the MFC 241a, the valve 243a and the nozzle 249a. The precursor gas refers to a gaseous precursor, for example, a gas obtained by vaporizing a precursor which remains in a liquid state under room temperature and atmospheric pressure, or a precursor which remains in a gas state under room temperature and atmospheric pressure. The halosilane refers to silane having a halogen group such as a chloro group or a fluoro group. An example of the halosilane precursor gas may include hexachlorodisilazane (($SiCl_3$)$_2$NH, abbreviation: HCDSN) gas. The HCDSN contains Si—N—Si bonds, in each of which two Si atoms are bonded to N (central element) contained in HCDSN. This facilitates inclusion of Si—N bonds in a film formed on the wafers 200 under the processing conditions of a film forming process to be described later.

An oxygen (O)-containing gas as an oxidant (oxidizing gas) is supplied from the gas supply pipe 232b into the process chamber 201 via the MFC 241b, the valve 243b and the nozzle 249b. An example of the O-containing gas may include water vapor ($H_2O$ gas). The $H_2O$ gas is a gas containing O and hydrogen (H) and having O—H bonds, that is, OH groups.

As a catalyst gas for promoting the film forming process to be described, an amine-based gas containing C, N and H is supplied from the gas supply pipe 232c into the process chamber 201 via the MFC 241c, the valve 243c and the nozzle 249c. An example of the amine-based gas may include a substance having an acid dissociation constant (pKa) of about 5 to 11, for example, a pyridine ($C_5H_5N$, pKa=5.67) gas. In some cases, a portion of the molecular structure of the amine-based gas may be decomposed in the film forming process to be described later. In some cases, the amine-based gas may not be said to be a "catalyst" in a strict sense. However, in this specification, a substance which is partially decomposed but not mostly decomposed in the course of a chemical reaction and acts substantially as a catalyst to change a reaction rate is referred to as a "catalyst". In this specification, a catalyst gas used in step 1 to be described later is also referred to as a first catalyst gas and a catalyst gas used in step 3 to be described later is also referred to as a second catalyst gas.

An inert gas, for example, a nitrogen ($N_2$) gas, is supplied from the gas supply pipes 232d to 232f into the process chamber 201 via the MFCs 241d to 241f, the valves 243d to 243f, the gas supply pipes 232a to 232c and the nozzles 249a to 249c, respectively.

A first supply system is mainly configured by the gas supply pipe 232a, the MFC 241a and the valve 243a. A second supply system is mainly configured by the gas supply pipe 232b, the MFC 241b and the valve 243b. A third supply system is mainly configured by the gas supply pipe 232c, the MFC 241c and the valve 243c. An inert gas supply system is mainly configured by the gas supply pipes 232d to 232f, the MFCs 241d to 241f and the valves 243d to 243f.

One or all of the above-described various supply systems may be configured as an integrated type supply system 248 in which the valves 243a to 243f, the MFCs 241a to 241f and so on are integrated. The integrated type supply system 248 is connected to each of the gas supply pipes 232a to 232f and is configured such that operations of supply of various gases into the gas supply pipes 232a to 232f, that is, an opening/closing operation of the valves 243a to 243f, a flow rate adjustment operation by the MFCs 241a to 241f, and the like, are controlled by a controller 121 which will be described later. The integrated type supply system 248 is configured as an integral type or division type integrated unit and may be attached to and detached from the gas supply pipes 232a to 232f and the like on an integrated unit basis, so that the maintenance, replacement, expansion, etc. of the integrated type supply system 248 can be performed on an integrated unit basis.

An exhaust pipe 231 for exhausting the internal atmosphere of the process chamber 201 is installed below the side wall of the reaction tube 203. A vacuum exhaust device, e.g., a vacuum pump 246, is connected to the exhaust pipe 231 via a pressure sensor 245, which is a pressure detector (pressure detecting part) for detecting the internal pressure of the process chamber 201, and an auto pressure controller (APC) valve 244, which is a pressure regulator (pressure regulating part). The APC valve 244 is configured to perform or stop vacuum exhaust in the process chamber 201 by opening or closing the valve while the vacuum pump 246 is actuated and is also configured to regulate the internal pressure of the process chamber 201 by adjusting an opening degree of the valve based on pressure information detected by the pressure sensor 245 while the vacuum pump 246 is actuated. An exhaust system is mainly configured by the exhaust pipe 231, the APC valve 244 and the pressure sensor 245. The vacuum pump 246 may be included in the exhaust system.

A seal cap 219, which serves as a furnace opening cover configured to hermetically seal a lower end opening of the manifold 209, is installed under the manifold 209. The seal cap 219 is made of metal such as, e.g., stainless steel (SUS) or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is installed under the seal cap 219. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured as a transfer device (transfer mechanism) which loads/unloads (transfers) the wafers 200 into/out of the process chamber 201 by moving the seal cap 219 up and down. In addition, a shutter 219s, which serves as a furnace opening cover configured to hermetically seal a lower end opening of the manifold 209 in a state where the seal cap 219 is lowered and the boat 217 is unloaded from the process chamber 201, is installed under the manifold 209. The shutter 219s is made of metal such as, e.g., stainless steel (SUS) or the like, and is formed in a disc shape. An O-ring 220c, which is a seal member making contact with the lower end portion of the manifold 209, is installed on an upper surface of the shutter 219s. The opening/closing operation (such as elevation operation, rotation operation or the like) of the shutter 219s is controlled by a shutter opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is to say, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that an interior of the process chamber 201 has a desired temperature distribution. The temperature sensor 263 is installed along the inner wall of the reaction tube 203.

Figure 3:
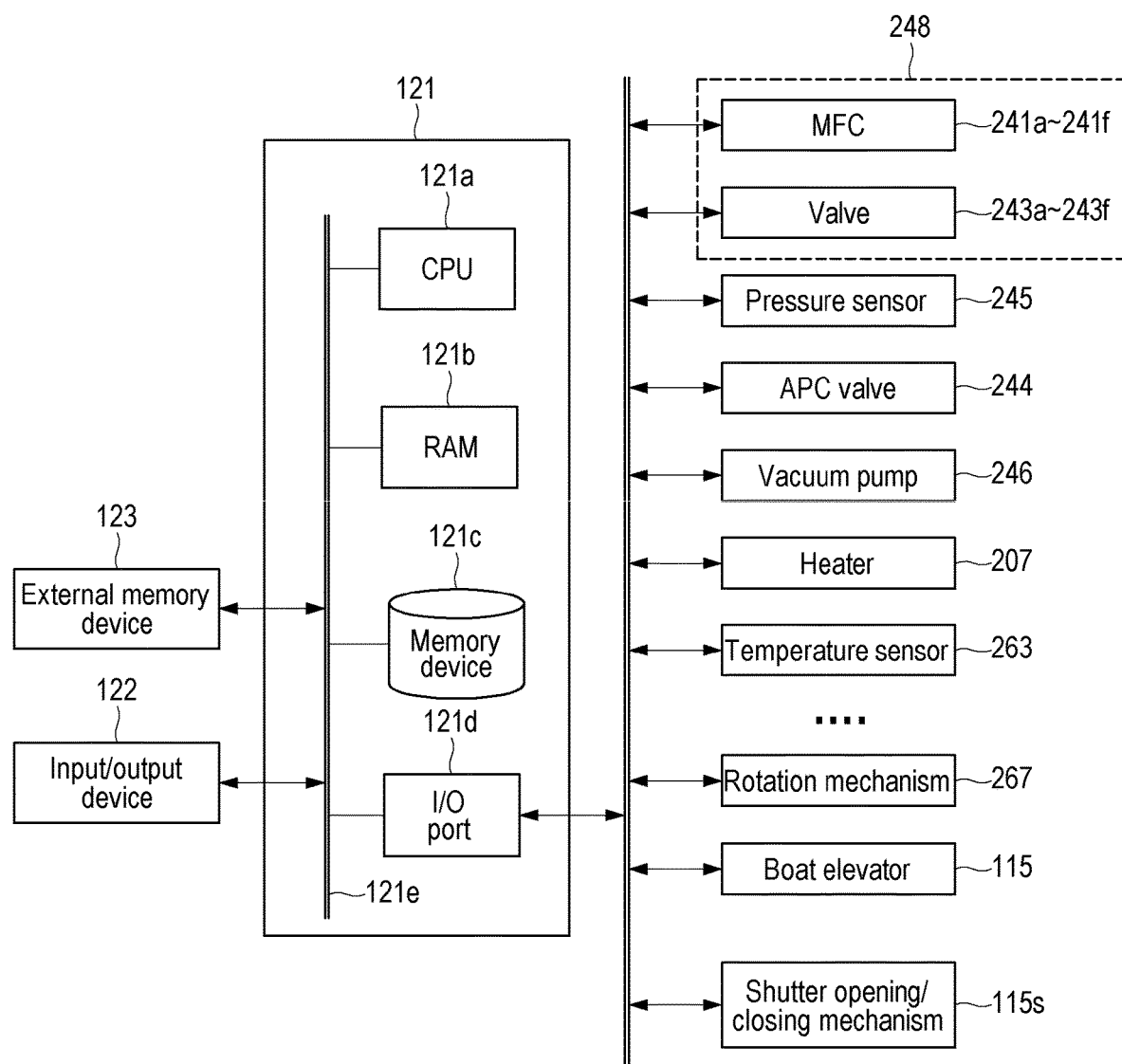
FIG. 3 is a schematic configuration diagram of a controller of the substrate processing apparatus used in an embodiment of the present disclosure, in which a control system of the controller is shown in a block diagram.

As illustrated in FIG. 3, a controller 121, which is a control part (control part), may be configured as a computer including a central processing unit (CPU) 121a, a random access memory (RAM) 121b, a memory device 121c and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured with, for example, a flash memory, a hard disk drive (HDD) or the like. A control program for controlling operations of a substrate processing apparatus and a process recipe, in which sequences and conditions of a film forming process to be described later are written, are readably stored in the memory device 121c. The process recipe functions as a program for causing the controller 121 to execute each sequence in the film forming process, which will be described later, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. In addition, the RAM 121b is configured as a memory area (work area) in which a program or data read by the CPU 121a is temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotation mechanism 267, the boat elevator 115, the shutter opening/closing mechanism 115s and the like.

The CPU 121a is configured to read and execute the control program from the memory device 121c. The CPU 121a also reads the recipe from the memory device 121c according to an input of an operation command from the input/output device 122 and the like. In addition, the CPU 121a is configured to control the flow rate adjusting operation of various kinds of gases by the MFCs 241a to 241f, the opening/closing operation of the valves 243a to 243f, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, the opening/closing operation of the shutter 219s with the shutter opening/closing mechanism 115s, and the like, according to contents of the read recipe.

The controller 121 may be configured by installing, on the computer, the aforementioned program stored in an external memory device 123 (for example, a magnetic disk such as a hard disk, an optical disc such as a CD, a magneto-optical disc such as an MO, a semiconductor memory such as a USB memory). The memory device 121c or the external memory device 123 is configured as a non-transitory computer-readable recording medium. Hereinafter, the aforementioned devices will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using communication means such as the Internet or a dedicated line, instead of using the external memory device 123.

(2) Film Forming Process

A sequence example of forming a thin film on a wafer 200 as a substrate using the aforementioned substrate processing apparatus, which is one of the processes for manufacturing a semiconductor device, will be described below with reference to FIG. 4A. In the following descriptions, the operations of the respective parts constituting the substrate processing apparatus are controlled by the controller 121.

Figure 4A:
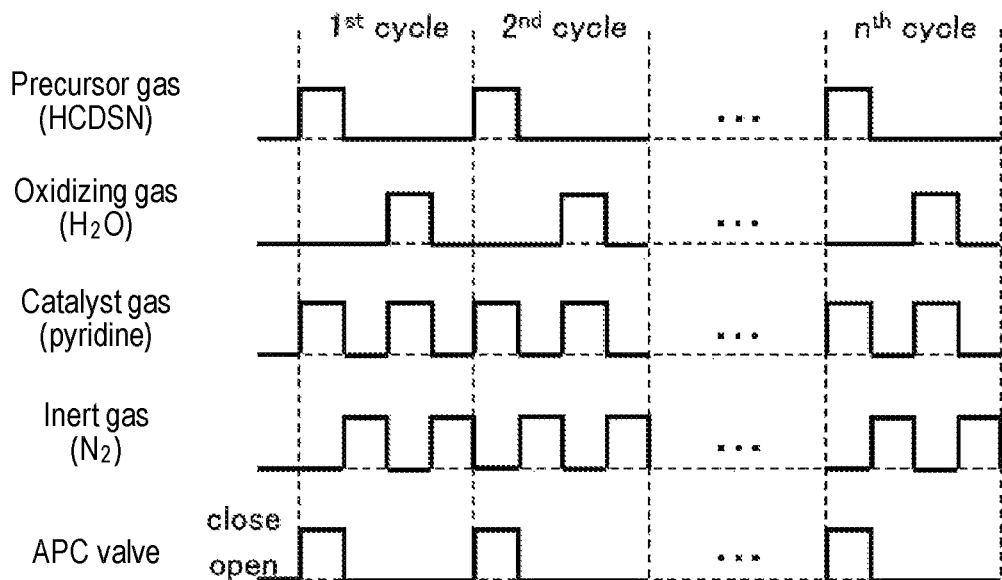
FIG. 4A is a diagram showing a film forming sequence according to an embodiment of the present disclosure and FIGS. 4B and 4C show modifications of the film forming sequence according to one embodiment of the present disclosure

In the film forming sequence shown in FIG. 4A, as a film containing at least Si, O and N, a silicon oxynitride film (SiON film) is formed on a wafer 200 by performing a cycle a predetermined number of times n (where n is an integer of 1 or more), the cycle including non-simultaneously performing: a step 1 of forming a first layer by supplying an HCDSN gas and a pyridine gas to the wafer 200, a step 2 of exhausting the HCDSN gas and the pyridine gas in a process chamber 201 through an exhaust system, a step 3 of forming a second layer by supplying an H₂O gas and a pyridine gas to the wafer 200 to modify the first layer in the process chamber 201, and a step 4 of exhausting the H₂O gas and the pyridine gas in the process chamber 201 through the exhaust system.

In at least a specific cycle when the cycle is performed a predetermined number of times, in at least one of the step 1 and the step 3, a process of supplying and confining each gas into the process chamber 201 in a state of closing the exhaust system (hereinafter, this process is simply referred to as "confining") is performed. The film forming sequence shown in FIG. 4A shows an example where the confining is performed only in step 1 but not in step 3 in every cycle when the cycle is performed n times. This sequence facilitates forming an N-rich SiON film having a relatively high N concentration for reasons to be described later.

In the present disclosure, for the sake of convenience, the film forming sequence shown in FIG. 4A may sometimes be denoted as follows. The same denotation will be used in modifications to be described later.

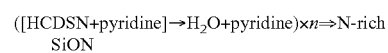

When the term "wafer" is used in the present disclosure, it may refer to a wafer itself or a wafer and a laminated body of predetermined layers or films formed on a surface of the wafer. When the phrase "a surface of a wafer" is used in the present disclosure, it may refer to a surface of a wafer itself or a surface of a predetermined layer formed on a wafer. When the expression "a predetermined layer is formed on a wafer" is used in the present disclosure, it may mean that a predetermined layer is directly formed on a surface of a wafer itself or that a predetermined layer is formed on a layer formed on a wafer. When the term "substrate" is used in the present disclosure, it may be synonymous with the term "wafer."

(Wafer Charging and Boat Loading)

When a plurality of wafers 200 is charged on the boat 217 (wafer charging), the shutter 219s is moved by the shutter opening/closing mechanism 115s and the lower end opening of the manifold 209 is opened (shutter open). Thereafter, as illustrated in FIG. 1, the boat 217 supporting the plurality of wafers 200 is lifted up by the boat elevator 115 to be loaded into the process chamber 201 (boat loading). In this state, the seal cap 219 seals the lower end of the manifold 209 through the O-ring 220b.

(Pressure Adjustment and Temperature Adjustment)

The interior of the process chamber 201, namely, a space in which the wafers 200 exist, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. The rotation of the wafers 200 by the rotation mechanism 267 begins. The actuation of the vacuum pump 246 and heating and rotation of the wafers 200 may be continuously performed at least until the processing of the wafers 200 is completed.

(Film Forming Process)

Thereafter, the following steps 1 to 4 are performed in a sequential manner.

[Step 1]

In this step, an HCDSN gas and a pyridine gas are supplied to the wafer 200 in the process chamber 201 under the condition that Si—N bonds contained in the HCDSN gas is retained without being cut.

More specifically, the APC valve 244 is fully closed and exhaust of the interior of the process chamber 201 by the exhaust system is stopped. In addition, the valves 243a and 243c are opened to allow the HCDSN gas to flow through the gas supply pipe 232a and the pyridine gas to flow through the gas supply pipe 232c, respectively. Flow rates of the HCDSN gas and the pyridine gas are adjusted by the MFCs 241a and 241c, respectively, and then the HCDSN gas and the pyridine gas are supplied into the process chamber 201 via the nozzles 249a and 249c, respectively, and are mixed in the process chamber 201. At the same time, the valves 243d to 243f may be opened to allow an $N_2$ gas to flow through the gas supply pipes 232d to 232f, respectively. A flow rate of the $N_2$ gas is adjusted by the MFCs 241d to 241f, and the $N_2$ gas is supplied into the process chamber 201 via the nozzles 249a to 249c.

The process conditions of this step are exemplified as follows.

HCDSN gas supply flow rate; 1 to 2,000 sccm, or 10 to 1,000 sccm in some embodiments, Pyridine gas supply flow rate: 1 to 2,000 sccm, or 10 to 1,000 sccm in some embodiments $N_2$ gas supply flow rate (per gas supply pipe): 0 to 10,000 sccm Each gas supply time: 1 to 100 seconds or, in some embodiments, 5 to 60 seconds.

By supplying the HCDSN gas and the pyridine gas into the process chamber 201 in a state where the exhaust system is closed, the internal pressure of the process chamber 201 begins to rise. The internal pressure (ultimate pressure) of the process chamber 201 that is finally reached by continuing the gas supply is set to fall within a range of, e.g., 400 to 5,000 Pa, and 500 to 4,000 Pa in some embodiments. By setting the internal pressure of the process chamber 201 to fall within such a relatively high pressure range, it is possible to thermally activate (excite) the HCDSN gas and the pyridine gas under a non-plasma atmosphere. Such thermally-activated HCDSN gas and pyridine gas make it possible to generate a relatively soft film forming reaction, as will be described later The temperature (treatment temperature) of the wafer 200 is set to fall within a range of, e.g., room temperature (20 to 30 degrees C.) to 150 degrees C., room temperature to 100 degrees C., or 50 to 100 degrees C. in some embodiments. If no pyridine gas is supplied at the time of supply of HCDSN gas, when the temperature of the wafer 200 is lower than 250 degrees C., hardly any of the HCDSN gas is chemisorbed onto the wafer 200, which may make it impossible to obtain a practical deposition rate. Even when the temperature of the wafer 200 is lower than 250 degrees C., this problem can be eliminated by supplying the pyridine gas together with the HCDSN gas. By setting the temperature of the wafer 200 to 150 degrees C. or lower or 100 degrees C. or lower in the presence of the pyridine gas, the amount of heat applied to the wafer 200 can be reduced and the control of the thermal history experienced by the wafer 200 can be advantageously performed. In the presence of the pyridine gas, when the temperature of the wafer 200 is equal to or higher than room temperature, it becomes possible to chemically adsorb HCDSN on the wafer 200 to further the film forming process.

By supplying the HCDSN gas and the pyridine gas to the wafer 200 under the aforementioned conditions, a first layer, for example, an Si-containing layer containing N and Cl and having a thickness of from less than one atomic layer (one molecular layer) to several atomic layers (several molecular layers), is formed on the wafer 200 (the base film of the surface thereof). The Si-containing layer containing N and Cl becomes a layer containing Si—N bonds and Si—Cl bonds. The Si-containing layer containing N and Cl may include an Si layer containing N and Cl, an adsorption layer of HCDSN, or both. In the present disclosure, the Si-containing layer containing N and Cl is also simply referred to as an Si-containing layer containing N.

The Si layer containing N and Cl encompasses a continuous or discontinuous layer containing N and Cl, which is composed of Si, and an Si thin film containing C and Cl, which is formed of the layers overlapping with one another. The Si which constitutes the Si layer containing N and Cl contains not only Si whose bond to N or Cl is not completely broken but also Si whose bond to N or Cl is completely broken.

The adsorption layer of HCDSN includes not only a continuous adsorption layer composed of HCDSN molecules but also a discontinuous adsorption layer. The HCDSN molecules that constitute the adsorption layer of HCDSN contain molecules in which Si—N bonds are partially broken and molecules in which Si—Cl bonds are partially broken, that is, molecules in which some thereof are decomposed. That is to say, the adsorption layer of HCDSN may include a physical adsorption layer of HCDSN, a chemisorption layer of HCDSN, or both.

In this regard, a layer having a thickness of less than one atomic layer (molecular layer) may mean an atomic layer (molecular layer) that is discontinuously formed. A layer having a thickness of one atomic layer (molecular layer) may mean an atomic layer (molecular layer) that is continuously formed. The Si-containing layer containing N and Cl may include both a Si layer containing N and Cl and an adsorption layer of HCDSN. However, since both have the same structure in which N and Cl are bonded to the main element (Si), the expressions such as "one atomic layer", "several atomic layers" and the like will be used for the Si-containing layer containing N and Cl, and the term "atomic layer" may be synonymous with the term "molecular layer."

When the thickness of the first layer exceeds several atomic layers, the effect of oxidation in step 3 to be described later does not reach the entire first layer. In addition, the minimum value of the thickness of the first layer is less than one atomic layer. Therefore, in some embodiments, the thickness of the first layer may be less than one atomic layer to several atomic layers. By setting the thickness of the first layer to one atomic layer or less, the effect of oxidation in step 3 to be described later can be relatively increased, and the time required for oxidation in step 3 can also be shortened. It is also possible to shorten the time required for forming the first layer in step 1. As a result, the processing time per cycle can be shortened, and the total processing time can be shortened. That is to say, it is also possible to increase a film deposition rate. In addition, by setting the thickness of the first layer to one atomic layer or less, it is also possible to enhance the controllability of film thickness uniformity.

Under a condition in which the HCDSN gas is autolyzed (or pyrolyzed), Si is deposited on the wafer 200 to form a Si layer containing N and Cl. Under a condition in which the HCDSN gas is not autolyzed (or pyrolyzed), HCDSN is adsorbed onto the wafer 200 to form an adsorption layer of HCDSN. Under any conditions, at least some of the Si—N bonds contained in the HCDSN gas are held (maintained) without being cut and are taken in the first layer as they are. From the viewpoint of increasing the film deposition rate, it may be more advantageous to form the Si layer containing N and Cl than to form the adsorption layer of HCDSN. However, in the present embodiment, since the temperature of the wafer 200 is set to a low temperature of, for example, 150 degrees C. or less, the adsorption layer of HCDSN is more likely to be formed on the wafer 200 than the Si layer containing N and Cl.

The pyridine gas acts as a catalyst gas (first catalyst gas) that weakens a bonding force of O—H bonds present on the surface of the wafer 200 to promote decomposition of the HCDSN gas so that the formation of the first layer by chemisorption of the HCDSN molecules can be promoted. For example, the pyridine gas acts on O—H bonds present on the surface of the wafer 200 to weaken their bonding force. When H having the weakened bonding force reacts with Cl of the HCDSN gas, gaseous substances containing Cl and H are generated, at which time H is desorbed from the surface of the wafer 200 and Cl is desorbed from the HCDSN molecules. The HCDSN molecules losing Cl are chemically adsorbed on the surface of the wafer 200 or the like. As a result, a chemical adsorption layer of HCDSN, more precisely a chemisorption layer of a substance obtained by decomposing a portion of HCDSN, is formed as the first layer on the wafer 200.

The bonding force of the O—H bonds present on the surface of the wafer 200 is weakened by the catalytic action of the pyridine gas because N having a lone electron pair in the pyridine molecules acts to attract H. A compound with larger pKa has a stronger force attracting H. When a compound with pKa of 5 or more is used as the first catalyst gas, the decomposition of HCDSN can be promoted to promote formation of the first layer by chemical adsorption. However, when a compound with excessively large pKa is used as the first catalyst gas, Cl extracted from the HCDSN molecules reacts with the first catalyst gas, which may result in the formation of a salt (particle source) such as ammonium chloride ($NH_4Cl$). Therefore, in some embodiments, a compound with pKa of, for example, 11 or less or 7 or less may be used, as the first catalyst gas. Since the pyridine gas has a relatively large pKa of about 5.67 which is smaller than 7, it can be suitably used as the first catalyst gas.

[Step 2]

After the first layer is formed, the valves 243a and 243c are closed to stop the supply of HCDSN gas and pyridine gas into the process chamber 201, respectively. Then, the interior of the process chamber 201 is evacuated to exclude a gas or the like remaining in the process chamber 201 from the interior of the process chamber 201. At this time, the valves 243d to 243f are opened to supply a $N_2$ gas into the process chamber 201. The $N_2$ gas acts as a purge gas to purge the interior of the process chamber 201.

[Step 3]

After step 2 is completed, an $H_2O$ gas and a pyridine gas are supplied to the wafer 200 in the process chamber 201 under the condition that the Si—N bonds contained in the first layer are retained without being cut. At this time, with the exhaust system opened, the $H_2O$ gas and the pyridine gas are supplied into the process chamber 201, and the confining of the $H_2O$ gas and the pyridine gas into the process chamber 201 is not performed.

More specifically, the APC valve 244 is opened and the interior of the process chamber 201 is exhausted by the exhaust system. The opening and closing control of the valves 243b, 243c and 243d to 243f is performed in the same procedure as the opening and closing control of the valves 243a, 243c and 243d to 243f in the step 1. The flow rates of the $H_2O$ gas and the pyridine gas are adjusted by the MFCs 241b and 241c, respectively, and the $H_2O$ gas and the pyridine gas are supplied and mixed into the process chamber 201 via the nozzles 249b and 249c and are exhausted from the exhaust pipe 231.

The process conditions of this step are exemplified as follows.

$H_2O$ gas supply flow rate: 10 to 10,000 sccm, or 100 to 1,000 sccm in some embodiments Processing pressure: 50 to 5,000 Pa, or 100 to 4,000 Pa in some embodiments Other processing conditions are the same as those as in the step 1, for example.

When the $H_2O$ gas and the pyridine gas are supplied to the wafer 200 under the aforementioned conditions, at least a portion of the first layer formed on the wafer 200 in step 1 is oxidized (reformed). When the first layer is reformed, a second layer containing Si, O and N, that is, a silicon oxynitride layer (SiON layer) is formed. When forming the second layer, at least some of the Si—N bonds contained in the first layer are held without being cut and are contained (left) in the second layer as they are. When forming the second layer, impurities such as Cl and the like contained in the first layer constitute a gaseous substance containing at least Cl in the course of the reforming reaction by the $H_2O$ gas, which is discharged from the process chamber 201. That is to say, the impurities such as Cl and the like in the first layer are extracted or desorbed from the first layer, thereby being separated from the first layer. As a result, the second layer has fewer impurities such as Cl and the like than the first layer.

The pyridine gas acts as a catalyst gas (second catalyst gas) that weakens a bonding force of O—H bonds of the $H_2O$ gas to promote decomposition of the $H_2O$ gas so that the formation of the second layer by reaction of the $H_2O$ gas with the first layer can be promoted. For example, the pyridine gas acts on O—H bonds of the $H_2O$ gas to weaken their bonding force. When H having the weakened bonding force reacts with Cl of the first layer formed on the wafer 200, gaseous substances containing Cl and H are generated, at which time H is desorbed from the $H_2O$ molecules and Cl is desorbed from the first layer. O in the $H_2O$ gas which has lost H is bonded with Si of the first layer in which at least some N are left after Cl is desorbed from the first layer, thereby forming an oxidized first layer, that is, the second layer, on the wafer 200.

The bonding force of the O—H bonds of the $H_2O$ gas is weakened by the catalytic action of the pyridine gas because N having a lone electron pair in the pyridine molecules acts to attract H, as in the step 1. When a compound with pKa of 5 or more is used as the second catalyst gas, the bonding force of the O—H bonds of the $H_2O$ gas can be appropriately weakened to facilitate the aforementioned oxidation reaction. In some embodiments, a compound with pKa of, for example, 11 or less, or 7 or less may be used, as the second catalyst gas. For example, the pyridine gas may be used in the same manner as the step 1.

[Step 4]

After the second layer is formed, the valves 243b and 243c are closed to stop the supply of $H_2O$ gas and pyridine gas into the process chamber 201, respectively. Then, a gas or the like remaining in the process chamber 201 is excluded from the interior of the process chamber 201 according to the same procedure as in the step 2.

(Performing Predetermined Number of Times)

A cycle including non-simultaneously performing the above-described steps 1 to 4 is performed once or more (n times) to thereby form a SiON film having a predetermined composition and a predetermined film thickness on the wafer 200. This cycle may be repeated multiple times. That is to say, the thickness of the second layer (SiON layer) formed per one cycle may be set to be smaller than a desired film thickness. Thus, the above cycle may be repeated multiple times until the film thickness of the SiON film formed by laminating the second layers becomes equal to the desired film thickness.

As the precursor gas, in addition to the HCDSN gas, at least one halosilane precursor gas selected from a group consisting of $NR(SiH_xCl_y)_2$, $NR_2(SiH_xCl_y)$, $N(SiH_xCl_yR_z)_3$, $NH(SiH_xCl_yR_z)_2$ and $NH_2(SiH_xCl_yR_z)$ (where x+y+z=3, and R is an alkyl group) can be used. These gases are gases containing at least Si—N bonds and Si—Cl bonds.

As the oxidizing gas, in addition to the $H_2O$ gas, an O-containing gas with O—H bonds such as a hydrogen peroxide ($H_2O_2$) gas or the like may be used. As the oxidizing gas, an O-containing gas with no O—H bonds such as an oxygen ($O_2$) gas, an ozone ($O_3$) gas, a hydrogen ($H_2$) gas+$O_2$ gas, a $H_2$ gas+$O_3$ gas or the like may also be used.

As the first and second catalyst gases, in addition to the pyridine gas, a cyclic amine-based gas such as an aminopyridine ($C_5H_6N_2$, pKa=6.89) gas, a picoline ($C_6H_7N$, pKa=6.07) gas, a lutidine ($C_7H_9N$, pKa=6.96) gas, a piperazine ($C_4H_{10}N_2$, pKa=9.80) gas or a piperidine ($C_5H_{11}N$, pKa=11.12) gas, a chain amine-based gas such as a triethylamine (($C_2H_5)_3N$, abbreviation: TEA, pKa=10.7) gas, a diethylamine (($C_2H_5)_2NH$, abbreviation: DEA, pKa=10.9) gas, a monoethylamine (($C_2H_5)NH_2$, abbreviation: MEA, pKa=10.6) gas, a trimethylamine (($CH_3)_3N$, abbreviation: TMA, pKa=9.8) gas or a monomethylamine (($CH_3)NH_2$, abbreviation: MMA, pKa=10.6) gas, or a non-amine-based gas such as an ammonia ($NH_3$) gas may be used. As the first and second catalyst gases, different kinds of gases may be used.

As the inert gas, in addition to the $N_2$ gas, a rare gas such as an Ar gas, a He gas, a Ne gas or a Xe gas may be used.

(After-Purge Step and Atmospheric Pressure Returning Step)

After a film having a desired composition and a desired film thickness is formed on the wafer 200, a $N_2$ gas as a purge gas is supplied into the process chamber 201 from each of the nozzles 249a to 249c and is exhausted through the exhaust pipe 231. Thus, the interior of the process chamber 201 is purged and the residual gas and the reaction byproducts remaining in the process chamber 201 are removed from the interior of the process chamber 201 (after-purge). Thereafter, the internal atmosphere of the process chamber 201 is substituted with an inert gas (inert gas substitution), and the internal pressure of the process chamber 201 is returned to an atmospheric pressure (return to atmospheric pressure).

(Boat Unload and Wafer Discharge)

The seal cap 219 is moved down by the boat elevator 115 to open the lower end of the manifold 209. The processed wafers 200 supported by the boat 217 are unloaded from the lower end of the manifold 209 outside of the reaction tube 203 (boat unload). After the boat unloading, the shutter 219s is moved, and the lower end opening of the manifold 209 is sealed by the shutter 219s through the O-ring 220c (shutter close). The processed wafers 200 are taken out from the reaction tube 203, and then discharged from the boat 217 (wafer discharge).

(3) Effects According to the Present Embodiment

According to the present embodiment, one or more effects set forth below may be achieved.

(a) By using a HCDSN gas containing Si—N bonds and Si—Cl bonds, the Si—N bonds contained in the HCDSN gas can be contained, as they are, in a film formed on the wafer 200. This makes it possible to form a film having excellent oxidation resistance (ashing resistance), thermal phosphoric acid resistance and hydrogen fluoride (HF) resistance on the wafer 200. In addition, when a gas containing two Si—N bonds in one molecule such as the HCDSN gas (a gas containing a Si—N—Si bond) is used as a precursor gas, since there is a low probability that both of the two Si—N bonds contained in one molecule of the precursor gas are cut off in the course of a film forming process, at least one of the Si—N bonds tends to be held without being cut. As a result, Si—N bonds can be more reliably added to the film formed on the wafer 200.

(b) By using the HCDSN gas containing Si—N bonds and Si—Cl bonds, the addition of N into the film formed on the wafer 200 can be promoted not in the form of N—H bond (which is likely to cause film oxidation) but in the form of Si—N bond (which is likely to suppress film oxidation. This makes it possible to form a film having high ashing resistance on the wafer 200.

(c) Due to the catalytic action of a pyridine gas, a film forming process can be performed under the aforementioned conditions, that is, the conditions of low temperature at which the HCDSN gas is not thermally decomposed when the HCDSN gas exists alone in the process chamber 201. This makes it possible to hold the Si—N bonds contained in the HCDSN gas without cutting them in the step 1. In addition, this makes it possible to hold the Si—N bonds contained in the first layer without cutting them in the step 3. That is to say, it is possible to perform the film forming process while leaving the Si—N bonds in tact within the HCDSN gas. As a result, it becomes possible to incorporate the Si—N bonds contained in the HCDSN gas into the film as they are, so that the addition of the Si—N bonds into the film formed on the wafer 200 can be promoted with high efficiency and reliability. Further, by performing the film forming process under the above-described low temperature conditions, it becomes possible to favorably control the thermal history of the wafer 200.

(d) By performing the confining of the HCDSN gas and the pyridine gas in the step 1, the decomposition of the HCDSN gas in the process chamber 201, that is, the formation of the first layer, can be properly promoted to increase a deposition rate of a SiON film to a practical level, as compared with a case where no confining is performed. Further, by performing the confining, it is possible to reduce the amount of gas discharged from the interior of the process chamber 201 without contributing to the film forming reaction, which may result in reduction of the gas cost.

(e) By performing the confining of the HCDSN gas and the pyridine gas in the step 1, the concentration of N in the first layer can be made higher than that in the case where no confining is performed, which makes it possible to form an N-rich SiON film on the wafer 200. This is because the chemical adsorption of HCDSN onto the wafer 200 is carried out at high density by performing the confining. The first layer formed by performing the confining becomes a dense layer containing a higher density and a larger amount of HCDSN molecules containing Si—N bonds than that of a layer formed when no confining is performed.

(f) By adjusting the time (hereinafter referred to as the confining time) during which the HCDSN gas and the pyridine gas are confined in the process chamber 201 in the step 1, it is possible to finely adjust the concentration of N in the first layer, that is, the composition of the SiON film formed on the wafer 200. For example, by lengthening the confining time in the step 1, it is possible to increase the density of HCDSN to be chemically adsorbed on the wafer 200 and to finely adjust the N concentration in the film to a higher level. Further, for example, by shortening the confining time in step 1, it is possible to decrease the density of HCDSN to be chemically adsorbed on the wafer 200 and to finely adjust the N concentration in the film to a lower level.

(g) By using two kinds of gases, that is, the HCDSN gas and the $H_2O$ gas, it becomes possible to form a multi-element (ternary) film containing Si, O and N. That is to say, it is unnecessary to separately supply three kinds of sources of Si, O and N when performing a cycle. Therefore, it is possible to shorten the required time per cycle and to improve the productivity of the film forming process. In addition, by reducing the types of gases required for film formation, it is possible to simplify the configuration of the gas supply system and to reduce the equipment costs and the like.

(h) Since the SiON film is deposited on the wafer 200 instead of oxynitriding the surface of the wafer 200, it is possible to suppress diffusion of O and N onto the surface of the wafer 200. This makes it possible to form a SiON film having desired insulation performance while keeping the diffusion depth of O or the like into the base layer within an allowable range, for example, when fabricating a memory device having a 3D structure.

(i) By forming the SiON film by the alternate supply method of non-simultaneously performing steps 1 to 4, it is possible to improve the step coverage of the SiON film, the film thickness controllability, the in-plane film thickness uniformity and the like over a case of forming the SiON film by a simultaneous supply method of simultaneously performing the steps 1 to 4. Such a method is particularly effective when the surface of the base layer of the film forming process has a 3D structure such as a line and space shape, a hole shape, a fin shape or the like.

(j) The above-described effects can be obtained in the same manner when a precursor gas other than the HCDSN gas is used, an oxidizing gas other than the $H_2O$ gas is used, or a catalyst gas other than the pyridine gas is used.

(4) Modifications

The film forming sequence in this embodiment may be changed to the following modifications.

First Modification

Figure 4B:
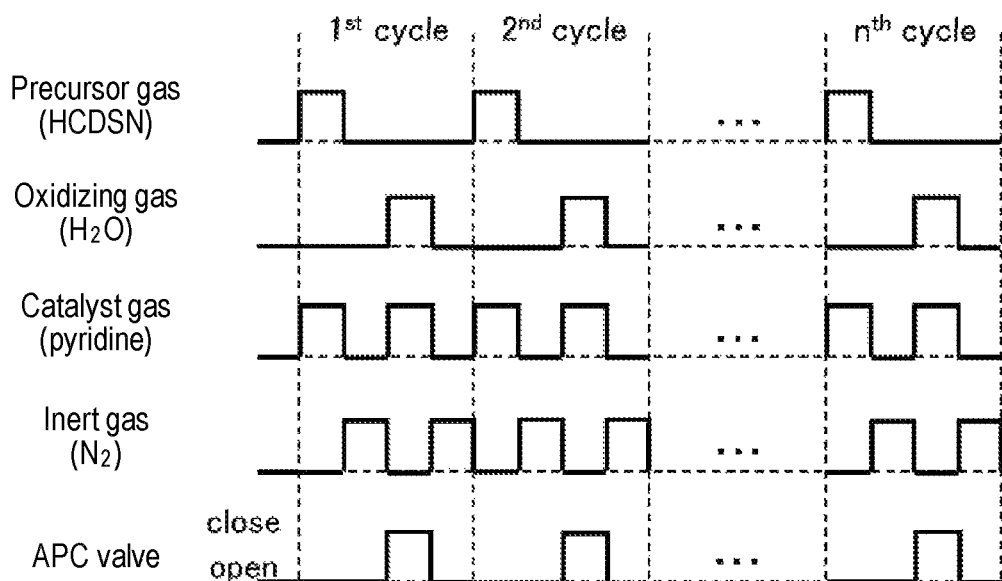

As in the film forming sequence shown in FIG. 4B and the following film forming sequence, the confining may be performed not in the step 1 but only in the step 3. In this case, it is possible to promote the oxidation of the first layer in the step 3 to thereby form an O-rich SiON film on the wafer 200.

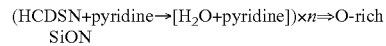

In addition, by performing the confining of the $H_2O$ gas and the pyridine gas in step 3, activation of these gases is promoted to facilitate promotion of oxidation of the first layer, that is, formation of the second layer. As a result, it is possible to shorten the required time per cycle and to increase the deposition rate of the SiON film, as compared with a case where no confining is performed. Further, by performing the confining, it is possible to reduce the amount of gas discharged from the interior of the process chamber 201 without contributing to the film forming reaction, which may result in reduction of the gas cost.

In addition, by adjusting the time during which the $H_2O$ gas and the pyridine gas are confined in the process chamber 201 in step 3 (the confining time), it is possible to finely adjust the concentration of O in the first layer, that is, the composition of the SiON film formed on the wafer 200. For example, by lengthening the confining time in step 3, it is possible to promote the addition of O into the first layer and to finely adjust the O concentration in the film to a higher level. Further, for example, by shortening the confining time in step 3, it is possible to suppress the addition of O into the first layer for suppressing excessive oxidation of the first layer and to finely adjust the O concentration in the film to a proper level.

Second Modification

Figure 4C:
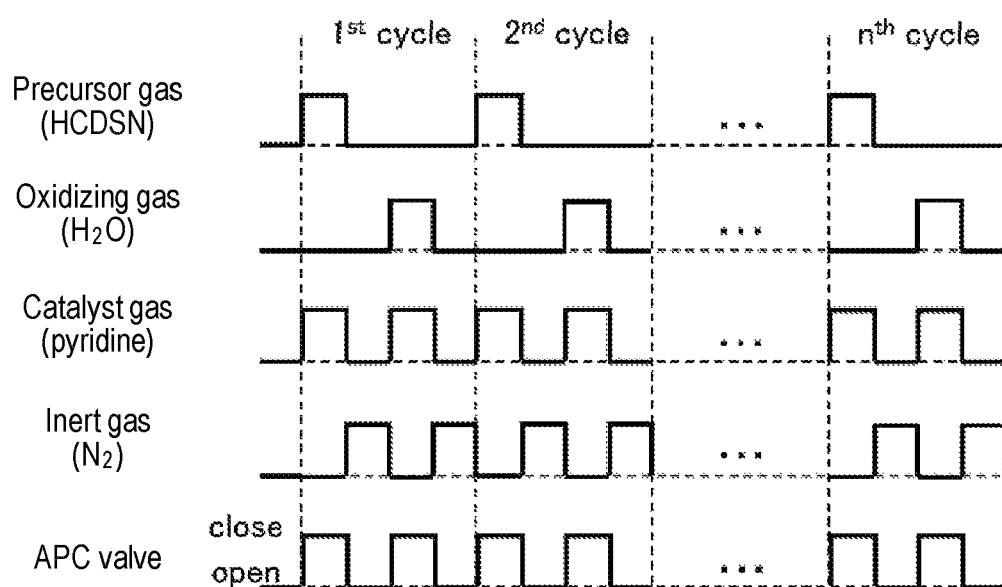

As in the film forming sequence shown in FIG. 4C and the following film forming sequence, the confining may be performed in both steps 1 and 3. In this case, the N concentration in the first layer can be increased in the step 1 and the oxidation of the first layer can be promoted in the step 3. As a result, it is possible to form an N-rich and O-rich SiON film on the wafer 200.

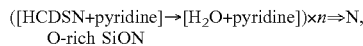
O-rich SiON

Even in this modification, the same effects as the film forming sequence shown in FIGS. 4A and 4B can be obtained. In addition, by performing the confining in both steps 1 and 3, it becomes possible to further increase the deposition rate of the SiON film. Further, by performing the confining in both steps, it is also possible to further reduce the gas cost, that is, the deposition cost. Further, according to this modification, it is also possible to control the composition of the SiON film in a wide range by adjusting the confining time in steps 1 and 3, respectively. For example, by making the confining time in the step 1 longer than that in step 3, it is possible to make the N concentration in the film higher than the O concentration and the Si concentration in the film. Further, for example, by making the confining time in step 3 longer than that in step 1, it is possible to further increase the O concentration in the film, for example, make the O concentration in the film higher than the N concentration and the Si concentration in the film.

Third Modification

Figure 5A:
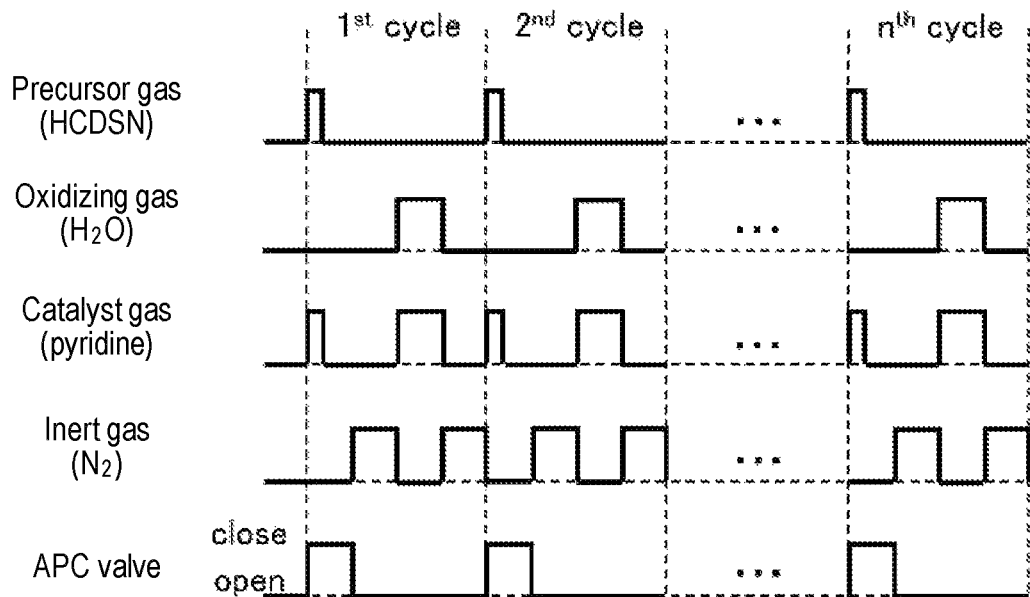
FIGS. 5A to 5C are diagrams showing modifications of a film forming sequence according to one embodiment of the present disclosure.
Figure 5B:
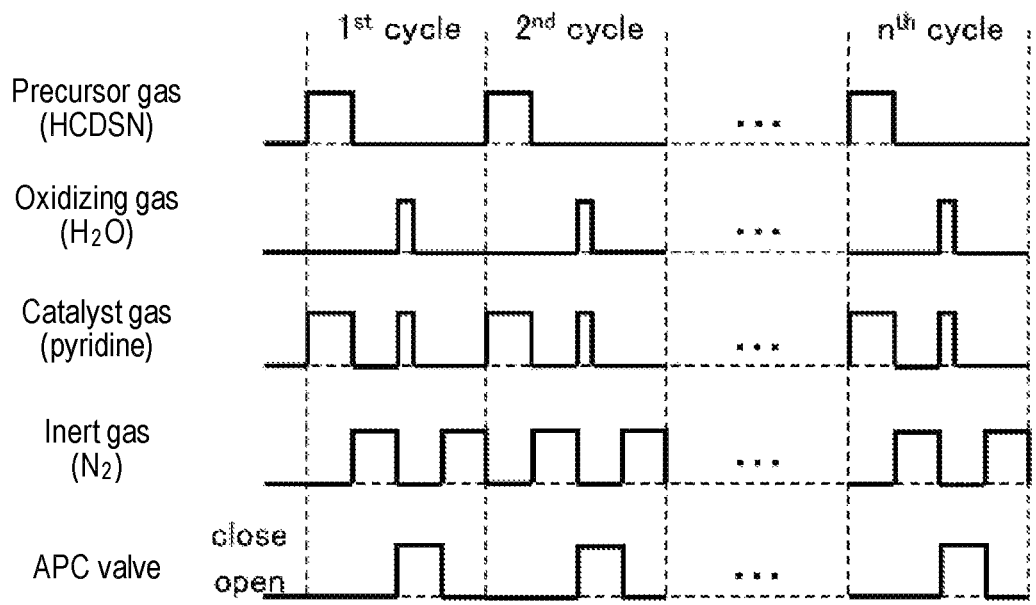
Figure 5C:
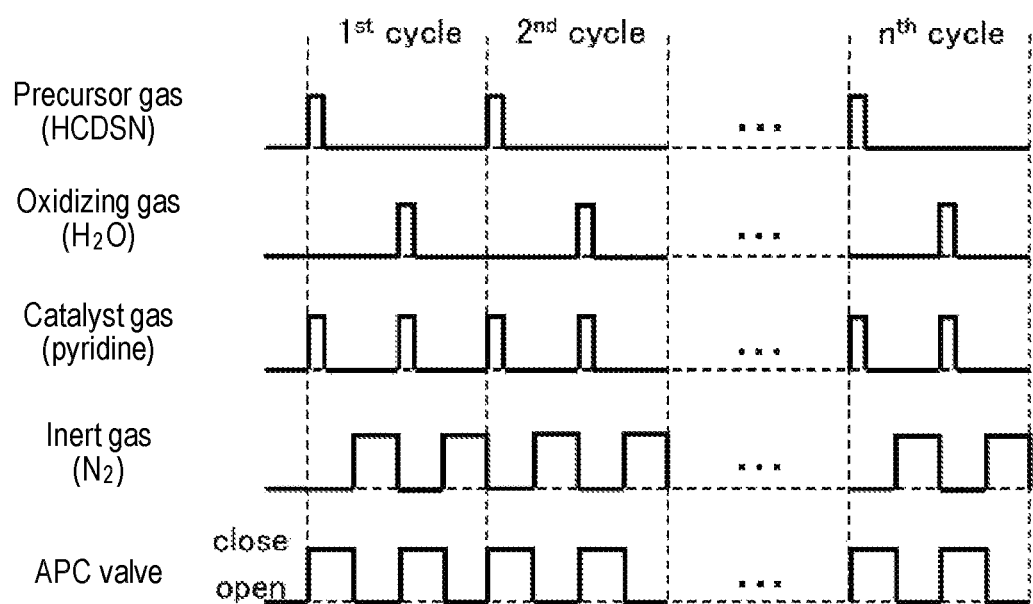

As shown in FIG. 5A, in step 1, the supply of the HCDSN gas and the pyridine gas may be performed only at the beginning of an exhaust system closing period. In addition, as shown in FIG. 5B, in step 3, the supply of the H$_2$O gas and the pyridine gas may be performed only at the beginning of the exhaust system closing period. Further, as shown in FIG. 5C, the film forming sequences shown in FIGS. 5A and 5B may be used in combination. This modification can achieve the same effects as the film forming sequence shown in FIG. 4A and the first and second modifications. Further, it is possible to further reduce the amount of gas discharged from the process chamber 201 without contributing to the film forming reaction, thereby further reducing the deposition cost.

Fourth Modification

As described above, as the precursor gas, in addition to the HCDSN gas, a gas including at least one selected from a group consisting of NR(SiH$_x$Cl$_y$)$_2$, NR$_2$(SiH$_x$Cl$_y$), N(SiH$_x$Cl$_y$R$_z$)$_3$, NH(SiH$_x$Cl$_y$R$_z$)$_2$ and NH$_2$(SiH$_x$Cl$_y$R$_z$) (where x+y+z=3, and R is an alkyl group) can be used. That is to say, a gas having not only Si—N bonds and Si—Cl bonds but also Si—C bonds and N—C bonds may be used. In this case, in addition to the Si—N bonds, the Si—C bonds and the N—C bonds can be added into the first layer formed on the wafer 200. As a result, it is possible to form a silicon oxycarbonitride film (SiOCN film) as a film containing Si, O, C and N on the wafer 200. In this modification, a N- and C-rich SiOCN film can be formed on the wafer 200 by performing the confining only in step 1 but no confining in step 3. In addition, an O-rich SiOCN film or an O-rich SiON film can be formed on the wafer 200 by performing the confining only in step 3 but no confining in step 1. Further, a N-, C- and O-rich SiOCN film can be formed on the wafer 200 by performing the confining in both steps 1 and 3.

Fifth Modification

In step 1, a second precursor gas containing Si—C bonds and Si—Cl bonds may be further supplied to the wafer 200 in the process chamber 201. In this case, it is possible to add the Si—C bonds in addition to the Si—N bonds into the first layer formed on the wafer 200. When this modification is applied to the film forming sequence shown in FIG. 4A, a SiOCN film can be formed on the wafer 200. Further, it is also possible to increase a cycle rate and the deposition rate of the finally formed SiOCN film.

As the second precursor gas, an alkylenehalosilane precursor gas such as a 1,2-bis (trichlorosilyl)ethane ((SiCl$_3$)$_2$C$_2$H$_4$, abbreviation: BTCSE) gas, a bis(trichlorosilyl)methane ((SiCl$_3$)$_2$CH$_2$, abbreviation: BTCSM) gas or the like or an alkylhalosilane precursor gas such as a 1,1,2,2-tetrachloro-1,2-dimethyldisilane ((CH$_3$)$_2$Si$_2$Cl$_4$, abbreviation: TCDMDS) gas, a 1,2-dichloro-1,1,2,2-tetramethyldisilane ((CH$_3$)$_4$Si$_2$Cl$_2$, abbreviation: DCTMDS) gas or the like can be used.

Sixth Modification

In step 1, a third precursor gas containing Si—Si bonds and Si—Cl bonds may be further supplied to the wafer 200 in the process chamber 201. In this case, it is possible to add the Si—Si bonds in addition to the Si—N bonds into the first layer formed on the wafer 200. When this modification is applied to the film forming sequence shown in FIG. 4A, a Si-rich SiON film can be formed on the wafer 200. Further, it is also possible to increase a cycle rate and the deposition rate of the finally formed SiON film.

As the third precursor gas, a halosilane precursor gas such as a hexachlorodisilane (Si$_2$Cl$_6$, abbreviation: HCDS) gas, an octachlorotrisilane (Si$_3$Cl$_8$, abbreviation: OCTS) gas or the like can be used.

Seventh Modification

By laminating two or more films having different chemical compositions in combination of the film forming sequence shown in FIG. 4A and the above-described modifications, a laminated film (stacked film) can be formed on the wafer 200.

For example, the N-rich SiON film formed by the film forming sequence shown in FIG. 4A, the O-rich SiON film formed by the film forming sequence shown in FIG. 4B and the SiON film formed by the film forming sequence in which no confining of gas into the process chamber 201 is performed in any of the steps 1 and 3 may be selected in an arbitrary combination and laminated in an arbitrary order to form a stacked film.

As a film constituting the stacked film, without being limited to the various SiON films described here, a Si-based insulating film such as a SiOCN film, a SiOC film, a silicon oxide film (SiO film) or the like may be arbitrarily selected. In addition, as a film forming method of forming each film constituting the stacked film, in addition to the film forming sequence shown in FIG. 4A and the methods described in the first to sixth modifications, methods of using the BTCSM gas and the HCDS gas and further an aminosilane precursor gas such as a bis-tertiary butyl aminosilane ($SiH_2[NH(C_4Hg)]_2$ gas, abbreviation: BTBAS) gas or the like may be used in proper combination (n1 and n2 are integers equal to or more than 1). In addition, in these methods, instead of the pyridine gas, a plasma-excited $O_2$ gas ($O_2$* gas) may be used as an oxidizing gas.

$$([HCDSN+pyridine] \rightarrow H_2O+pyridine) \times n_1 \Rightarrow$$
$$([BTCSM+pyridine] \rightarrow H_2O+pyridine) \times$$
$$n_2 \Rightarrow SiOC/SiON$$

$$([HCDSN+pyridine] \rightarrow H_2O+pyridine) \times n_1 \Rightarrow (HCDS+$$
$$pyridine] \rightarrow H_2O+pyridine) \times n_2 \Rightarrow SiO/SiON$$

$$([HCDSN+pyridine] \rightarrow H_2O+pyridine) \times n_1 \rightarrow ([BT-$$
$$BAS \rightarrow O_2^*) \times n_2 \Rightarrow SiO/SiON$$

$$([NR(SiH_xCl_y)_2+pyridine] \rightarrow +H_2O+pyridine) \times n_1 \rightarrow$$
$$([BTCSM+pyridine] \rightarrow H_2O+pyridine) \times$$
$$n_2 \Rightarrow SiOC/SiOCN$$

$$([NR(SiH_xCl_y)_2+pyridine] \rightarrow H_2O+pyridine) \times n_1 \rightarrow$$
$$([HCDS+pyridine] \rightarrow H_2O+pyridine) \times n_2 \Rightarrow SiO/SiOCN$$

$$([NR(SiH_xCl_y)_2+pyridine] \rightarrow H_2O+pyridine) \times n_1 \rightarrow$$
$$([BTBAS \rightarrow O_2^*) \times n_2 \Rightarrow SiO/SiOCN$$

This modification can achieve the same effects as the film forming sequence shown in FIG. 4A and the above-described modifications. Further, according to this modification, it is also possible to change the composition of the stacked film stepwise from the bottom surface to the top surface of the film.

Eighth Modification

By alternately laminating the plurality of films having different compositions with a nano-level thickness in combination of the film forming sequence shown in FIG. 4A and the above-described modifications, a nano-level laminated film (nano-laminate film) can be formed on the wafer 200.

For example, a first cycle of performing the confining only in step 1 but not in step 3 and a second cycle of performing the confining only in step 3 but not in step 1 may be alternately repeated. In this case, a nano-laminate film formed by alternately laminating an N-rich SiON film formed in the first cycle and an O-rich SiON film formed in the second cycle at a nano level can be formed on the wafer 200. In addition, for example, a first cycle in which the confining is performed in both steps 1 and 3 and the confining time in step 1 is made longer than the confining time in step 3 and a second cycle in which the confining time in step 1 is made shorter than the confining time in step 3 may be alternately repeated. Even in this case, a nano-laminate film can be formed as described above. A film constituting the nano-laminate film is not limited to the various SiON films described here, but a Si-based insulating film such as a SiOCN film, a SiOC film, a SiO film or the like may be arbitrarily selected. As a method of forming a film constituting the nano-laminate film, in addition to the film forming sequence shown in FIG. 4A and the methods described in the first to sixth modifications, various different types of methods of using a BTCSM Gas, a HCDS gas, a BTBAS gas, $O_2$* and the like as exemplified in the seventh modification can be used in proper combination.

This modification can also achieve the same effects as the film forming sequence shown in FIG. 4A and the above-described modifications. The thickness of each film constituting the nano-laminate film is set to fall within a range of, e.g., 0.1 nm or more to 5 nm or less. Thus, the finally formed nano-laminate film can have the characteristics unified in the laminating direction, that is, the inseparable characteristics of the entire film. By making the thickness of each film constituting the nano-laminate film small in this manner, it is possible to improve the surface roughness of the nano-laminate film, that is, to make the surface of this film a smooth surface with less height difference in the wafer plane. Further, according to the present modification, it is also possible to change the composition of the nano-laminate film stepwise or continuously from the bottom surface to the top surface of the film.

Other Embodiments of the Present Disclosure

While some embodiments of the present disclosure have been specifically described above, the present disclosure is not limited to the aforementioned embodiments but may be differently modified without departing from the subject matter of the present disclosure.

The case where the confining is performed in at least one of steps 1 and 3 has been described in the above embodiments, but the confining may not be performed in both steps 1 and 3.

The example in which the oxidizing gas and the second catalyst gas are supplied after supplying the precursor gas and the first catalyst gas has been described in the above embodiments, but the order of supplying these gases may be reversed. That is, after supplying the oxidizing gas and the second catalyst gas, the precursor gas and the first catalyst gas may be supplied. This makes it possible to change the film quality and the composition ratio of a film to be formed.

In the above embodiments, the APC valve 244 may not be fully closed but slightly opened when closing the exhaust system. This makes it possible to form a slight flow of gas from the interior of the process chamber 201 to the exhaust pipe 231 and remove reaction byproducts and the like generated in the process chamber 201 from the interior of the process chamber 201, thereby improving the quality of the film forming process. In the present disclosure, not only the full closing of the APC valve 244 but also the slight opening thereof may be included in the closed state of the exhaust system.

The example in which the second catalyst gas and the oxidizing gas are supplied in the non-plasma atmosphere in the step 3 has been described in the above embodiments, but a plasma-excited oxidizing gas may be supplied without using the second catalyst gas. The processing conditions at this time may be the same as those in the above embodiments.

By using the silicon-based insulating film of the above embodiment as a sidewall spacer, it is possible to provide a device forming technique with less leak current and excellent processability. In addition, by using the silicon-based insulating film as an etching stopper, it is also possible to provide a device forming technique with excellent processability. Further, according to the above embodiments, since the film forming process can be performed without using plasma, this process can be applied to a process that concerns plasma damage, such as when forming an SADP film of DPT.

Recipes used in substrate processing may be prepared individually according to the processing contents and may be stored in the memory device 121c via a telecommunication line or the external memory device 123. Moreover, at the start of the substrate processing, the CPU 121a may properly select an appropriate recipe from the recipes stored in the memory device 121c according to the processing contents. Thus, it is possible for a single substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

The example in which films are formed using a batch-type substrate processing apparatus capable of processing a plurality of substrates at a time has been described in the above embodiments. The present disclosure is not limited to the above embodiments but may be appropriately applied to, e.g., a case where films are formed using a single-wafer-type substrate processing apparatus capable of processing a single substrate or several substrates at a time. In addition, the example in which films are formed using a substrate processing apparatus provided with a hot-wall-type processing furnace has been described in the above embodiments. The present disclosure is not limited to the above embodiments but may be appropriately applied to a case where films are formed using a substrate processing apparatus provided with a cold-wall-type processing furnace.

In the case of using these substrate processing apparatuses, film formation may be performed according to the same processing procedures and processing conditions as those in the above embodiments and modifications and the same effects as those of the above embodiments and modifications can be achieved.

The above embodiments and modifications may be used in proper combination. The processing procedures and processing conditions used at this time may be the same as those of the above embodiments.

According to the present disclosure in some embodiments, it is possible to increase the productivity of a film forming process and improve the controllability of the composition ratio of a film when forming a Si-based insulating film on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming a film containing at least Si, O and N on a substrate in a process chamber by performing a cycle a predetermined number of times, the cycle including non-simultaneously performing:
        forming a first layer by supplying a precursor gas containing at least a Si—N bond and a Si—Cl bond and a first catalyst gas to the substrate;
        exhausting the precursor gas and the first catalyst gas in the process chamber through an exhaust system;
        forming a second layer by supplying an oxidizing gas and a second catalyst gas to the substrate to modify the first layer; and
        exhausting the oxidizing gas and the second catalyst gas in the process chamber through the exhaust system.

2. The method of claim 1, wherein the Si—N bond contained in the precursor gas is held without being cut, and is incorporated, as it is, into the first layer in the act of forming the first layer.

3. The method of claim 2, wherein the Si—N bond contained in the first layer is held without being cut, and is incorporated, as it is, into the second layer in the act of forming the second layer.

4. The method of claim 1, wherein, in at least a specific cycle when the cycle is performed the predetermined number of times, at least one of the act of forming the first layer and the act of forming the second layer includes supplying and confining each of the gases into the process chamber in a state in which the exhaust system is closed.

5. The method of claim 4, wherein, in at least the specific cycle, the act of forming the first layer includes supplying and confining the precursor gas and the first catalyst gas into the process chamber in the state in which the exhaust system is closed.

6. The method of claim 5, wherein the confining is performed so as to make a concentration of N in the first layer higher than a concentration of N in the first layer in a case where the confining is not performed.

7. The method of claim 5, wherein a concentration of N in the first layer is finely adjusted by adjusting a confining time.

8. The method of claim 4, wherein, in at least the specific cycle, the act of forming the second layer includes supplying and confining the oxidizing gas and the second catalyst gas into the process chamber in the state in which the exhaust system is closed.

9. The method of claim 8, wherein the confining is performed so as to make a concentration of O in the second layer higher than a concentration of O in the second layer in a case where the confining is not performed.

10. The method of claim 8, wherein a concentration of O in the second layer is finely adjusted by adjusting a confining time.

11. The method of claim 1, wherein the precursor gas includes at least one selected from a group consisting of $NH(SiCl_3)_2$, $NR(SiH_xCl_y)_2$, $NR_2(SiH_xCl_y)$, $N(SiH_xCl_yR_z)_3$, $NH(SiH_xCl_yR_z)_2$ and $NH_2(SiH_xCl_yR_z)$ (where $x+y+z=3$, and R is an alkyl group).

12. The method of claim 1, wherein the precursor gas contains a Si—N—Si bond.

13. The method of claim 1, wherein the oxidizing gas includes at least one selected from a group consisting of $H_2O$, $H_2O_2$, $O_3$ and $O_2$.

14. The method of claim 1, wherein the oxidizing gas contains an O—H bond.

15. The method of claim 1, wherein the catalyst gas includes at least one selected from a group consisting of pyridine, aminopyridine, picoline, lutidine, piperazine, piperidine, triethylamine, diethylamine, monoethylamine, trimethylamine, dimethylamine, monomethylamine and ammonia.

16. The method of claim 1, wherein the act of forming the first layer includes further supplying a second precursor gas containing a Si—C bond and a Si—Cl bond to the substrate.

17. The method of claim 1, wherein the act of forming the first layer includes further supplying a third precursor gas containing a Si—Si bond and a Si—Cl bond to the substrate.

18. A substrate processing apparatus comprising:
a process chamber configured to accommodate a substrate;
a first supply system configured to supply a precursor gas to the substrate in the process chamber;
a second supply system configured to supply an oxidizing gas to the substrate in the process chamber;
a third supply system configured to supply a catalyst gas to the substrate in the process chamber;
an exhaust system configured to exhaust an interior of the process chamber; and
a controller configured to control the first supply system, the second supply system, the third supply system and the exhaust system so as to form a film containing at least Si, O and N on the substrate in the process chamber by performing a cycle a predetermined number of times, the cycle including non-simultaneously performing:
forming a first layer by supplying a precursor gas containing at least a Si—N bond and a Si—Cl bond and a first catalyst gas to the substrate;
exhausting the precursor gas and the first catalyst gas in the process chamber through an exhaust system;
forming a second layer by supplying an oxidizing gas and a second catalyst gas to the substrate to modify the first layer; and
exhausting the oxidizing gas and the second catalyst gas in the process chamber through the exhaust system.

19. A non-transitory computer-readable recording medium storing a program that causes a computer to perform a process of forming a film containing at least Si, O and N on a substrate in a process chamber of a substrate processing apparatus by performing a cycle a predetermined number of times, the cycle including non-simultaneously performing:
forming a first layer by supplying a precursor gas containing at least a Si—N bond and a Si—Cl bond and a first catalyst gas to the substrate;
exhausting the precursor gas and the first catalyst gas in the process chamber through an exhaust system;
forming a second layer by supplying an oxidizing gas and a second catalyst gas to the substrate to modify the first layer; and
exhausting the oxidizing gas and the second catalyst gas in the process chamber through the exhaust system.

* * * * *